(12) United States Patent
Zhuang et al.

(10) Patent No.: US 6,204,176 B1
(45) Date of Patent: Mar. 20, 2001

(54) SUBSTITUTED PHENYLETHYLENE PRECURSOR DEPOSITION METHOD

(75) Inventors: Wei-Wei Zhuang; Lawrence J. Charneski, both of Vancouver; Sheng Teng Hsu, Camas, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/351,645

(22) Filed: Jul. 12, 1999

Related U.S. Application Data (60) Provisional application No. 60/107,892, filed on Nov. 10, 1998.

(51) Int. Cl.[7] .................................................. H01L 21/44
(52) U.S. Cl. ............................................. 438/681; 438/654
(58) Field of Search ...................................... 438/584, 625, 438/644, 652, 654, 680, 677, 681, 687

(56) References Cited

U.S. PATENT DOCUMENTS

| | | | |
|---|---|---|---|
| 4,385,005 | 5/1983 | Doyle | 260/464 |
| 4,425,281 | 1/1984 | Doyle | 260/430 |
| 4,434,317 | 2/1984 | Doyle et al. | 585/845 |
| 5,028,724 | 7/1991 | Ivankovits et al. | 556/40 |
| 5,085,731 * | 2/1992 | Norman et al. | 156/646 |
| 5,096,737 | 3/1992 | Baum et al. | 427/38 |
| 5,098,516 * | 3/1992 | Norman et al. | 156/666 |
| 5,144,049 * | 9/1992 | Norman et al. | 556/12 |
| 5,187,300 * | 2/1993 | Norman | 556/12 |
| 5,273,775 * | 12/1993 | Dyer et al. | 427/99 |

(List continued on next page.)

OTHER PUBLICATIONS

C. Y. Chang and S. M. Sze, VLSI Technology, 1996, McGraw–Hill Companies, Inc., pp. 389–391.*
Stanley Wolf, Silicon Processing for the VLSI Era vol. 2: Process Integration, 1990, Lattice Press, p. 193.*
"MOCVD of Copper from the Solution of New and Liquid Precursor" by H.K. Shin, Y.H. Cho, D.J. Yoo, H.J. Shin & E.S. Lee published in Mat. Res. Soc. Symp Proc. vol. 514. Abstract Only.
Article entitled, "Low–Temperature Chemical Vapor Deposition of High–Purity Copper from an Organometallic source", by D.B. Beach, F.K. LeGoues & C.K. Hu, published in Chem. Mater.;1990, pp. 216–219.
Article entitled, "Hot–Wall Chemical Vapor Deposition of Copper from Copper(I) Compounds. 2. Selective, Low–Temperature Deposition of Copper from Copper(I), etc." by H.K. Shin, K.M. Chi, M.J. Hampden–Smith, T.T. Kodas, J.D. Farr & M. Paffett, published in Chem. Mater.1992, 4, pp. 788–795.

(List continued on next page.)

*Primary Examiner*—Matthew Smith
*Assistant Examiner*—Calvin Lee
(74) *Attorney, Agent, or Firm*—David C. Ripma; Matthew Rabdau; Scott C. Krieger (57) ABSTRACT

A method for using a Cu(hfac) precursor with a substituted phenylethylene ligand to form an adhesive seed layer on an IC surface has been provided. The substituted phenylethylene ligand includes bonds to molecules selected from the group consisting of $C_1$ to $C_6$ alkyl, $C_1$ to $C_6$ haloalkyl, phenyl, H and $C_1$ to $C_6$ alkoxyl. One variation, the α-methylstyrene ligand precursor has proved to be especially adhesive. Copper deposited with this precursor has low resistivity and high adhesive characteristics. The seed layer provides a foundation for subsequent Cu layers deposited through either CVD, PVD, or electroplating. The adhesive seed layer permits the subsequent Cu layer to be deposited through an economical high deposition rate process.

12 Claims, 5 Drawing Sheets

U.S. PATENT DOCUMENTS 5,354,712 * 10/1994 Ho et al. .............................. 437/195
5,913,147 *  6/1999 Dubin et al. ......................... 438/687
6,001,730 * 12/1999 Farkas et al. ....................... 438/627

OTHER PUBLICATIONS

Article entitled, "Alkene and Carbon Monoxide Derivatives of Copper(I) and Silver(I), etc.", by G. Doyle, K.A. Eriksen & D. Van Engen, published in Organometallics 1985, pp. 830–835.

Article entitled "Copper(I) tertt–Butly 3–Oxobutanoate Complexes as Precursors for Chemical Vapor Deposition of Copper", by H Choi and S. Hwang, published in Chem. Mater. 1998, 10, pp. 2326–2328.

Article entitled "Chemical Vapor Deposited Copper from Alkyne Stabilized Copper(I) Hexafluoroacetylacetonate Complexes", by T.H. Baum and C.E. Larson, published in J. Electrochem. Soc. vol. 140, No. 1 Jan. 1993, pp. 154–158.

\* cited by examiner

SUBSTITUTED PHENYLETHYLENE PRECURSOR DEPOSITION METHOD

This invention claims the benefit of a provisional application Serial No. 60/107,892, filed Nov. 10, 1998, entitled "Improved Copper Precursor and Synthesis Method", having the same inventors as the present application.

BACKGROUND AND SUMMARY OF THE INVENTION

This invention relates generally to integrated circuit processes and fabrication, and more particularly, to a precursor and synthesis method, having a substituted phenylethylene ligand, such as α-methylstyrene, which improves liquid phase stability, and which is capable of depositing copper at high deposition rates, low resistivity, and with good adhesion on selected integrated circuit surfaces.

The demand for progressively smaller, less expensive, and more powerful electronic products, in turn, fuels the need for smaller geometry integrated circuits (ICs) on larger substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the area of the interconnecting surfaces is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the operation of high speed ICs. Propagation discontinuities also result from intersecting conduction surfaces that are poorly connected, or from the joining of conductors having highly different impedance characteristics.

There is a need for interconnects and vias to have both low resistivity, and the ability to withstand process environments of volatile ingredients. Aluminum and tungsten metals are often used in the production of integrated circuits for making interconnections or vias between electrically active areas. These metals are popular because they are easy to use in a production environment, unlike copper which requires special handling.

Copper (Cu) would appear to be a natural choice to replace aluminum in the effort to reduce the size of lines and vias in an electrical circuit. The conductivity of copper is approximately twice that of aluminum and over three times that of tungsten. As a result, the same current can be carried through a copper line having nearly half the width of an aluminum line.

The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore barriers are typically erected to prevent copper from migrating. Elements of copper migrating into these semiconductor regions can dramatically alter the conduction characteristics of associated transistors. Another problem with the use of copper is the relatively high temperature needed to deposit it on, or removing it from, an IC surface. These high temperatures can damage associated IC structures and photoresist masks.

It is also a problem to deposit copper onto a substrate, or in a via hole, using the conventional processes for the deposition of aluminum when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, first, a physical vapor deposition (PVD), and then, a chemical vapor deposition (CVD) technique, have been developed by the industry.

With the PVD technique, an IC surface is exposed to a copper vapor, and copper is caused to condense on the surfaces. The technique is not selective with regard to surfaces. When copper is to be deposited on a metallic surface, adjoining non-conductive surfaces must either be masked or etched clean in a subsequent process step. As mentioned earlier, photoresist masks and some other adjoining IC structures are potentially damaged at the high temperatures at which copper is processed. The CVD technique is an improvement over PVD because it is more selective as to which surfaces copper is deposited on. The CVD technique is selective because it is designed to rely on a chemical reaction between the metallic surface and the copper vapor to cause the deposition of copper on the metallic surface.

In a typical CVD process, copper is combined with a ligand, or organic compound, to help insure that the copper compound becomes volatile, and eventually decomposes, at consistent temperatures. That is, copper becomes an element in a compound that is vaporized into a gas, and later deposited as a solid when the gas decomposes. Selected surfaces of an integrated circuit, such as diffusion barrier material, are exposed to the copper gas, or precursor, in an elevated temperature environment. When the copper gas compound decomposes, copper is left behind on the selected surface. Several copper gas compounds are available for use with the CVD process. It is generally accepted that the configuration of the copper gas compound, at least partially, affects the ability of the copper to be deposited on to the selected surface.

Copper metal thin films have been prepared via chemical vapor deposition by using many different kinds of copper precursors. In 1990, D. B. Beach et al. *Chem. Mater.* (2) 216 (1990) obtained pure copper films via CVD by using ($\eta^5$—$C_5H_5$)Cu(PMe$_3$), and later, in 1992, H. K. Shin et al., *Chem. Mater.* (4) 788 (1992) declared the same results by using (hfac)Cu(PR$_3$)$_n$(R=methyl and ethyl and n=1 and 2). However, these copper precursors are solids, which can not be used in the liquid delivery system for copper thin film CVD processing. Furthermore, the copper films often contain large amounts of carbon and phosphorus contamination, which can not be used as interconnectors in ICs.

$Cu^{2+}$(hfac)$_2$, or copper (II) hexafluoroacetylacetonate, precursors have previously been used to apply CVD copper to IC substrates and surfaces. However, these $Cu^{2+}$ precursors are notable for leaving contaminates in the deposited copper, and for the relatively high temperatures that must be used to decompose the precursor into copper.

Earlier studies of copper precursors concentrated on the evaluation of a series of copper(I) fluorinated β-diketonate complexes, which have been proven to be very promising sources for the use in the chemical vapor deposition of copper metal thin films. Copper(I) fluorinated β-diketonate complexes were first synthesized by Gerald Doyle, U.S. Pat. No. 4,385,005 (1983) and 4,425,281 (1984), in which he presented the synthesis method and their application in the separation of unsaturated organic hydrocarbons. In the U.S. Pat. No. 5,096,737 (1992), Thomas H. Baum, et at., claimed the application of these copper(I) fluorinated β-diketonate complexes as copper precursors for CVD copper thin film preparation. Copper thin films have been prepared via chemical vapor deposition using these precursors.

Among several liquid copper precursors, 1,5-dimethyl 1,5-cyclooctadiene copper(I) hexafluoroacetylacetonate mixed with 1,6-dimethyl 1,5-cyclooctadiene copper(I) hexafluoroacetylacetonate ((DMCOD)Cu(hfac)) and hexyne copper(I) hexafluoroacetylacetonate ((HYN)Cu(hfac) were evaluated in detail. The copper thin films deposited using (DMCOD)Cu(hfac) have very good adhesion to metal or metal nitride substrates, but a high resistivity (2.5 $\mu\Omega$·cm) and a low deposition rate. (HYN)Cu(hfac) copper film has poor adhesion to a TiN substrate, and high resistivity (~2.1 $\mu\Omega$·cm). Another compound, butyne copper(I)(hfac), ((BUY)Cu(hfac)), gives a copper film with low resistivity (1.93 $\mu\Omega$·cm), but has poor adhesion and is relatively expensive. Also, the compound is a solid and, therefore, difficult to use in a liquid delivery system. The invention of copper(I)(hfac) stabilized with a series of trialkylvinylsilane (John A. T. Norman et al., U.S. Pat. No. 5,085,731 (1992)) improved the properties of copper thin films.

Copper films deposited using a liquid copper precursor, (hfac)Cu(TMVS), where TMVS=trimethylvinylsilane, have low resistivities and reasonable adhesion to substrates. This precursor is useful because it can be used at relatively low temperatures, approximately 200° C. This liquid copper precursor has been used for the preparation of copper metal thin films via CVD for some time, but there are still some drawbacks: stability, the adhesion of copper films, and cost for the trimethylvinylsilane stabilizer. Also, the precursor is not especially stable, and can have a relatively short shelf life if not refrigerated. Various ingredients have been added to (hfac)Cu(tmvs) to improve its adhesiveness, temperature stability, and the rate at which it can be deposited on an IC surface. U.S. Pat. No. 5,744,192, entitled "Method Of Using Water To Increase The Conductivity Of Copper Deposited With Cu(HFAC)TMVS", invented by Nguyen et al., discloses a precursor and method of improving the electrical conductivity of Cu deposited with (hfac)Cu(tmvs).

It is generally acknowledged in the industry that (hfac) Cu(tmvs) becomes unstable, and begins to decompose, above 35° C. Use of a (hfac)Cu(tmvs) precursor stored at this temperature leads to undesirable process results. The effectivity of (hfac)Cu(tmvs) stored at temperatures lower than 35° C. is also unpredictable. A "fresh" batch of precursor, or precursor stored at temperatures well below room temperature, is used to guarantee predictable processes.

A Cu precursor comprising a substituted phenylethylene, and synthesis method for same, is disclosed in co-pending U.S. Ser. No. 09/210,099, entitled "Substituted Phenylethylene Precursor and Synthesis Method", invented by Zhuang et al. The above-mentioned application is incorporated by reference herein.

It would be advantageous if a copper precursor was found that effectively deposits copper with low resistivity and good adhesion properties. It would be further advantageous if this precursor was inexpensive to synthesize.

It would be advantageous if a Cu precursor could be deposited on an IC wafer with great adhesion, to permit the deposition of a subsequent Cu film at high deposition rates.

Accordingly, a method for depositing a copper (Cu) seed layer on an integrated circuit (IC) wafer is provided comprising the steps of:

a) volatizing a Cu precursor compound including $Cu^{+1}$ (hexafluoroacetylacetonate), and a substituted phenylethylene ligand including one phenyl group bonded to a first carbon atom, with the remaining bond to said first carbon atom being selected from a first group consisting of $C_1$ to $C_6$ alkyl, $C_1$ to $C_6$ haloalkyl, phenyl, and $C_1$ to $C_6$ alkoxyl, and in which a second carbon atom includes a second and third bond, said second and third bonds being selected from the group consisting of H, $C_1$ to $C_6$ alkyl, phenyl, and $C_1$ to $C_6$ alkoxyl, preferably, the substituted phenylethylene ligand is α-methylstyrene;

b) decomposing the Cu precursor compound on a Cu-receiving surface of the IC wafer to form a Cu seed-layer, whereby the seed layer is formed through chemical vapor deposition (CVD); and c) forming a second layer of Cu overlying the Cu seed layer, whereby the Cu seed layer enhances adhesion between the Cu films and Cu-receiving surface.

In some aspects of the invention the Cu precursor compound includes an additive to create a Cu precursor blend. Then, the Cu precursor blend further includes an additive of approximately 15%, or less, substituted phenylethylene, as measured by weight ratio of the Cu precursor compound. When Step a) includes the substituted phenylethylene ligand being α-methylstyrene, then the substituted phenylethylene ligand in the additive is also α-methylstyrene.

Once the seed layer is in place, Step c) includes depositing the second Cu layer with deposition methods selected from the group consisting of CVD, physical vapor deposition (PVD), and electroplating. An α-methylstyrene Cu precursor could even be used to form a relatively thick second Cu layer, as compared to the Cu seed layer thickness, at high deposition rates.

DETAILED DESCRIPTION OF THE PREFERRED EMBODIMENT

The substituted phenylethylene ligand copper precursor, disclosed below, is inexpensive to synthesize. Compared to trimethylvinylsilane, which costs approximately $165 per 100 g, α-methylstyrene is inexpensive, at approximately $0.60 per 100 g. The precursor is stable at room temperature for easy storage and handling. Despite retaining its liquid phase at room temperature, it is highly volatile at higher temperatures. Therefore, no decomposition occurs in the CVD liquid delivery line and vaporizer, which requires precursor stability at 90 degrees C, under vacuum, for four minutes. Further, the precursor has excellent adhesion to metal and metal nitride Cu-receiving substrate surfaces, such as W, Ti, TiN, Ta, TaN, Al, Pt, WN, and similar barrier materials. The copper deposited with precursor has low resistivity (<1.9 $\mu\Omega\cdot$cm), high electromigration resistance, and excellent conformality to severe surface morphology.

Figure 1:
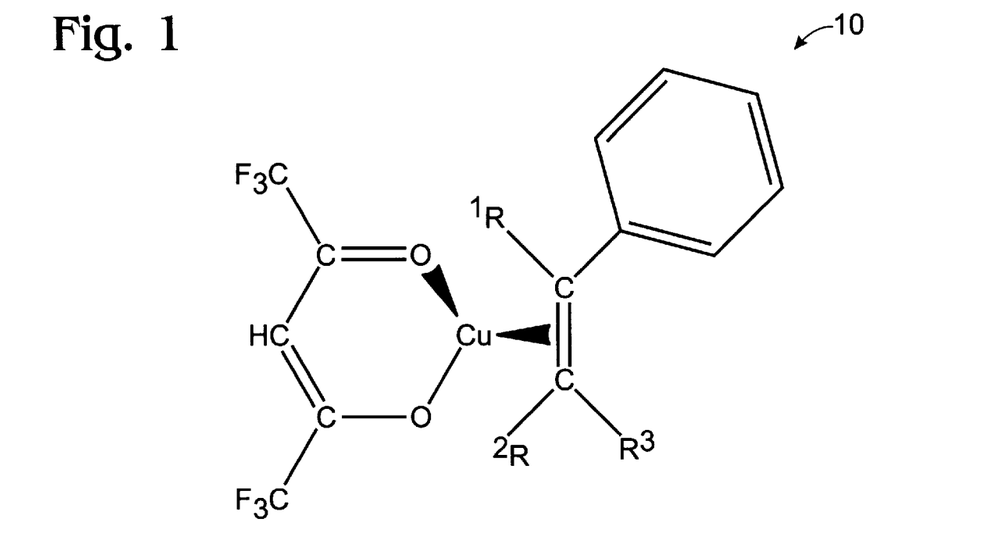
FIG. 1 is a schematic representation of the present invention precursor with a substituted phenylethylene ligand.

FIG. 1 is a schematic representation of the present invention precursor with a substituted phenylethylene ligand. Volatile copper (Cu) precursor compound 10 is used for the chemical vapor deposition (CVD) of copper (Cu) to selected surfaces. Precursor compound 10 comprises $Cu^{+1}$ (hexafluoroacetylacetonate) and a substituted phenylethylene ligand.

Figure 2:
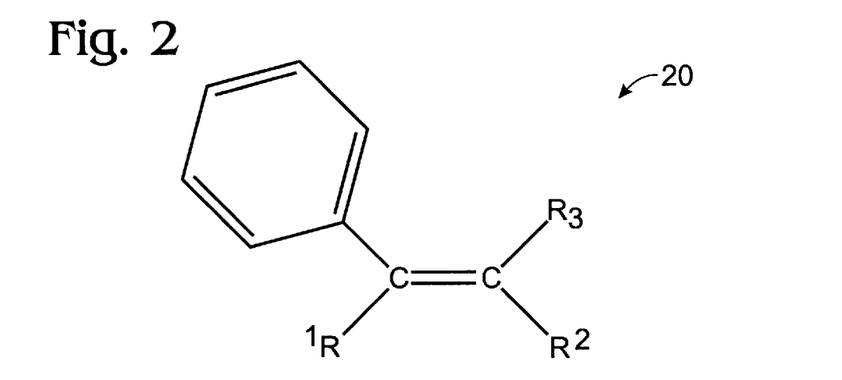
FIG. 2 is a schematic representation of the substituted phenylethylene ligand.

FIG. 2 is a schematic representation of substituted phenylethylene ligand 20. Substituted phenylethylene ligand 20 includes one phenyl group bonded to a first carbon atom, with the remaining bond to the first carbon atom being selected from a first group of potential molecules represented by $R^1$. The $R^1$ group consists of $C_1$ to $C_6$ alkyl, $C_1$ to $C_6$ haloalkyl, phenyl, and $C_1$ to $C_6$ alkoxyl. The second carbon atom includes a second and third bond selected, respectively, from a second and third group of molecules represented by $R^2$ and $R^3$. The second and third bonds, $R^2$ and $R^3$, are selected from the group consisting of H, $C_1$ to $C_6$ alkyl, phenyl, and $C_1$ to $C_6$ alkoxyl. The second and third bonds ($R^2$ and $R^3$) vary independently from each other. In this manner, a stable precursor capable of high Cu deposition rates is formed.

Figure 3:
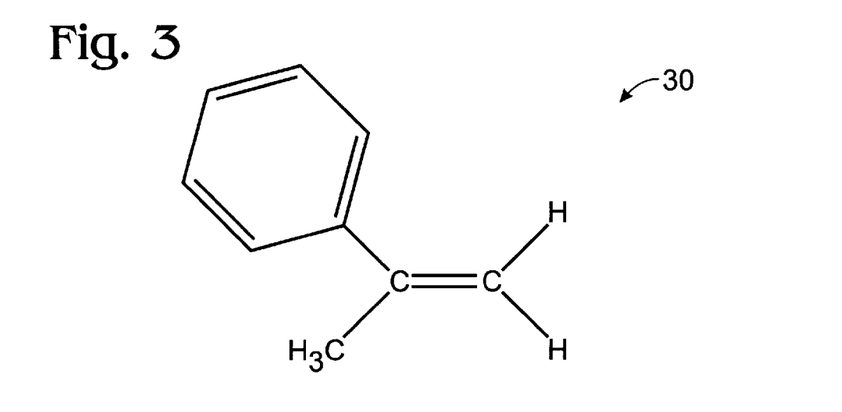
FIG. 3 is a schematic representation of the preferred embodiment α-methylstyrene ligand.

FIG. 3 is a schematic representation of the preferred embodiment α-methylstyrene ligand 30. First bond ($R^1$) is $H_3C$, the second bond ($R^2$) is H, and the third bond ($R^3$) is H, whereby an α-methylstyrene ligand is formed.

To improve and facilitate a stable liquid phase precursor, in some aspects of the invention, compound 10 includes an additive to create a precursor blend. The precursor blend further comprises:

approximately 15%, or less, substituted phenylethylene 20 (see FIG. 2), as measured by weight ratio of the precursor compound.

The blend further comprising the substituted phenylethylene additive having the following structural formula:

in which $R^1$ is selected from the group consisting of $C_1$ to $C_6$ alkyl, $C_1$ to $C_6$ haloalkyl, phenyl, and $C_1$ to $C_6$ alkoxyl;

in which $R^2$ is selected from the group consisting of H, $C_1$ to $C_6$ alkyl, phenyl, and $C_1$ to $C_6$ alkoxyl; and in which $R^3$ is selected from the group consisting of H, $C_1$ to $C_6$ alkyl, phenyl, and $C_1$ to $C_6$ alkoxyl, whereby the precursor is further stabilized in a liquid phase.

The substituted phenylethylene ligand selected to form the precursor is the same substituted phenylethylene ligand used as the additive to form the precursor blend. That is, when the precursor uses an α-methylstyrene ligand, the additive is also an α-methylstyrene.

Figure 4:
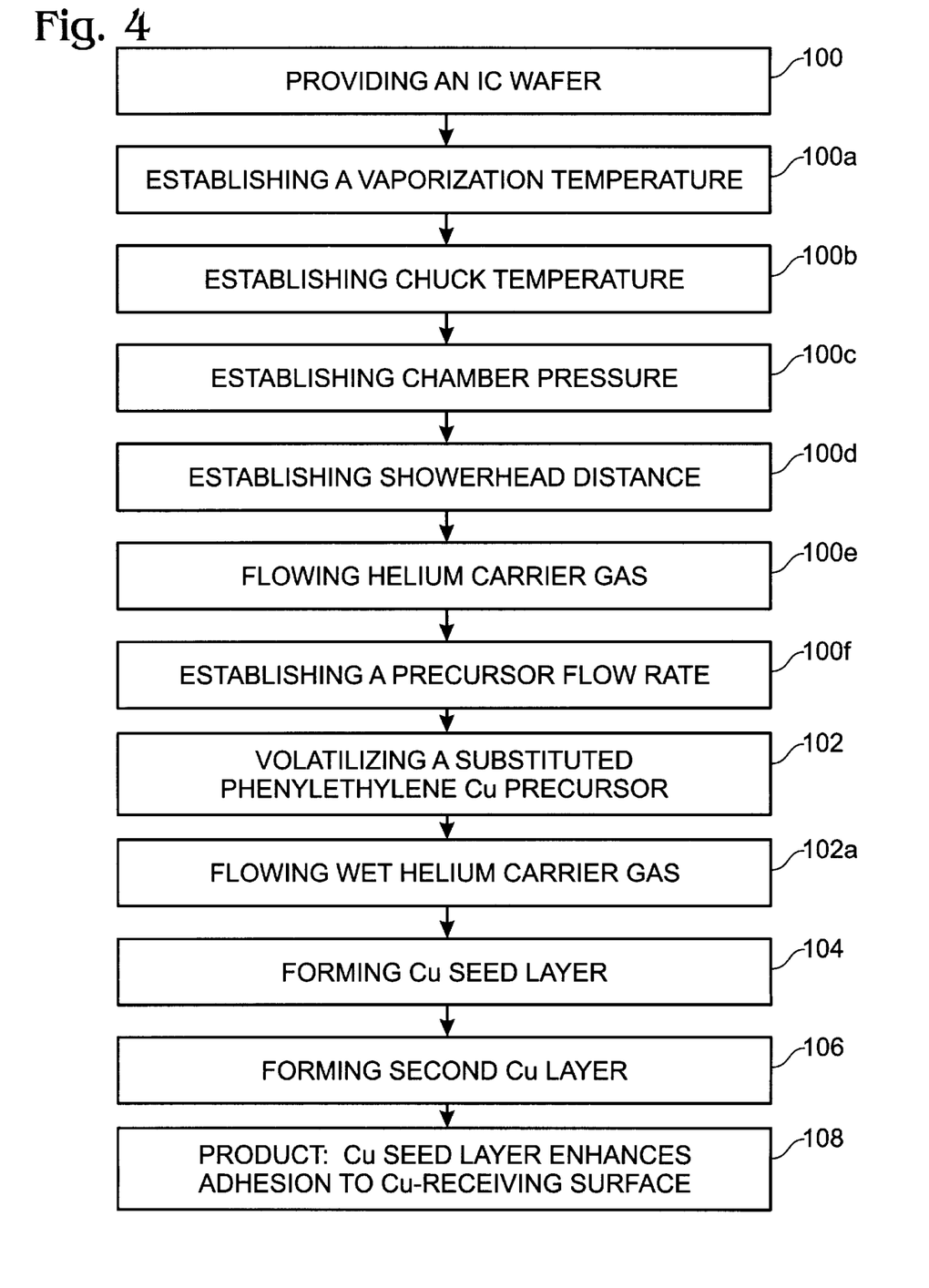
FIG. 4 is a flowchart illustrating a method for depositing a copper (Cu) seed layer.

FIG. 4 is a flowchart illustrating a method for depositing a copper (Cu) seed layer. Step 100 provides an integrated circuit (IC) wafer. Step 102 volatilizes a Cu precursor compound includes $Cu^{+1}$(hexafluoroacetylacetonate), and a substituted phenylethylene ligand including one phenyl group bonded to a first carbon atom. The remaining bond to the first carbon atom is selected from a first group consisting of $C_1$ to $C_6$ alkyl, $C_1$ to $C_6$ haloalkyl, phenyl, and $C_1$ to $C_6$ alkoxyl. A second carbon atom includes a second and third bond. The second and third bonds are selected from the group consisting of H, $C_1$ to $C_6$ alkyl, phenyl, and $C_1$ to $C_6$ alkoxyl.

In some aspects of the invention, Step 102 includes the second and third bonds varying independently from each other. Preferably, Step 102 includes the first bond being $H_3C$, the second bond being H, and the third bond being H, whereby an α-methylstyrene ligand is formed.

In some aspects of the invention, a further step precedes Step 102. Step 100a includes forming a liquid Cu precursor compound comprising an additive to create a Cu precursor blend. The Cu precursor blend further comprises:

approximately 15%, or less, substituted phenylethylene, as measured by weight ratio of the Cu precursor compound, to facilitate a stable liquid phase precursor.

Step 100a includes the additive having the following structural formula:

$R^1$ is selected from the group consisting of $C_1$ to $C_6$ alkyl, $C_1$ to $C_6$ haloalkyl, phenyl, and $C_1$ to $C_6$ alkoxyl. $R^2$ is selected from the group consisting of H, $C_1$ to $C_6$ alkyl, $C_1$ to $C_6$ phenyl, and $C_1$ to $C_6$ alkoxyl. $R^3$ is selected from the group consisting of H, $C_1$ to $C_6$ alkyl, phenyl, and $C_1$ to $C_6$ alkoxyl, whereby the precursor is further stabilized in a liquid phase.

Typically, Step 100a includes the substituted phenylethylene ligand of the Cu precursor compound being the same substituted phenylethylene ligand as the additive. So if the precursor compound includes an α-methylstyrene ligand, the additive is an α-methylstyrene ligand.

Step 104 decomposes the Cu precursor compound on a Cu-receiving surface of the IC wafer to form a Cu seed-layer, whereby the seed layer is formed through chemical vapor deposition (CVD). Step 106 forms a second layer of Cu overlying the Cu seed layer. Step 106 includes depositing the second Cu layer with deposition methods selected from the group consisting of CVD, physical vapor deposition (PVD), and electroplating. That is, once the adhesive seed layer is applied, other more cost effective methods may be used to complete the formation of the copper film. Step 108 is a product where the Cu seed layer enhances adhesion between the Cu films and Cu-receiving surface.

In some aspects of the invention, Step 100 provides a chamber having a wafer chuck, on which the IC is mounted. Step 100 also provides a showerhead, or equivalent, vapor distribution system. Further steps, detailing the process, precede Step 102. Step 100b establishes a vaporizing temperature in the range of 60 to 80 degrees C. Step 100c establishes a chuck temperature in the range of approximately 140 to 230 degrees C. Step 100d establishes a chamber pressure in the range of approximately 0.1 to 2 torr (T). A pressure of 0.3 to 1.2 T is generally preferred. Step 100e establishes a distance between the showerhead and the Cu-receiving surface in the range of 15 to 60 millimeters (mm).

Step 100f establishes a helium carrier gas flow rate, to carry the Cu precursor compound vapor, in the range of 10 to 400 standard cubic centimeters (sccm). A flow rate of approximately 30 to 150 sccm is generally preferred. Step 100g establishes a liquid precursor flow rate in the range of 0.05 to 0.7 milliliters pre minute (mL/min). A rate of 0.07 to 0.2 is generally preferred. This precursor flow rate assumes a deposition efficiency of approximately 13%.

Other steps follow Step 102. Step 102a establishes a wet helium gas flow rate, to carry water vapor, in the range of approximately 0.1 to 50 sccm. A flow rate of 0.5 to 10 sccm is generally preferred.

Figure 5:
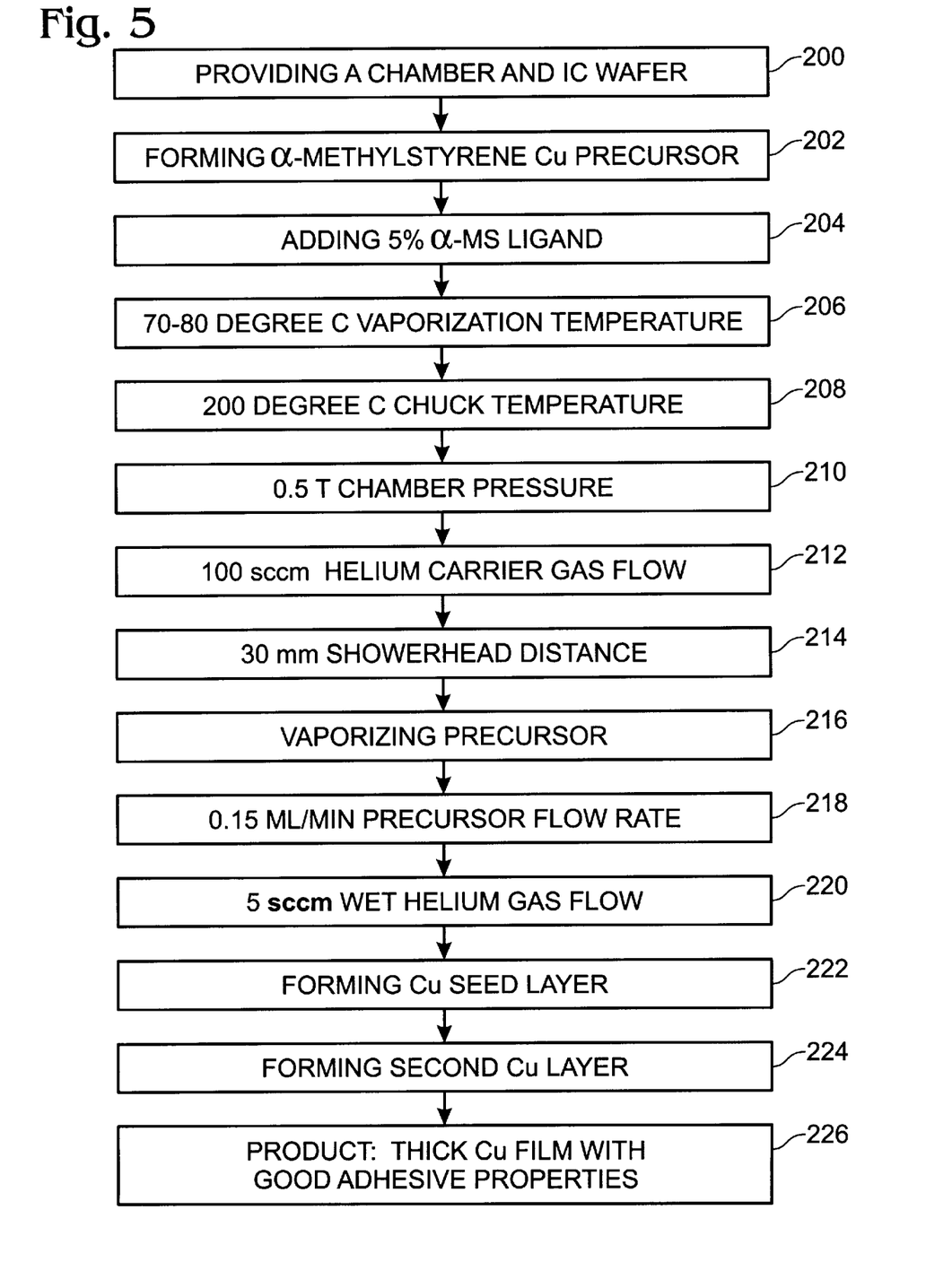
FIG. 5 is a flowchart illustrating one preferred embodiment of the deposition technique of FIG. 4 to form a Cu seed layer on a Cu-receiving surface.

FIG. 5 is a flowchart illustrating one preferred embodiment of the deposition technique of FIG. 4 to form a Cu seed layer on a Cu-receiving surface. Step 200 provides a chamber having a wafer chuck to receive an integrated circuit (IC) wafer, and a showerhead to distribute materials on a Cu-receiving surface of the IC wafer. Step 202 forms a liquid Cu precursor compound including $Cu^{+1}$ (hexafluoroacetylacetonate) and an α-methylstyrene ligand. Step 204 adds approximately 5% α-methylstyrene ligand, as measured by weight ratio of the Cu precursor compound, to create a Cu precursor compound blend. Step 206 vaporizes the Cu precursor compound blend at a temperature in the range of approximately 70 to 80 degrees C., with 65 degrees C. being preferred. Step 208 heats the wafer chuck to a temperature of approximately 200 degrees C. Step 210 creates a chamber pressure of approximately 0.5 T. Step 212 carries the vaporized Cu precursor compound blend with a helium carrier gas flow of approximately 100 sccm. Step 214 establishes a distance between the showerhead and the Cu-receiving surface of approximately 30 mm. This showerhead distance is effective for a variety of showerheads. This distance would typically be modified when using atypical showerheads or other types of material distribution equipment.

Step 216 volatilizes the Cu precursor compound blend, which includes the 5% additive. Step 218 flows the Cu precursor compound blend at a liquid precursor flow rate in the range of approximately 0.15 mL/min. Step 220 carries water vapor with a helium gas flow rate of approximately of 5 sccm.

In response to Steps 200 through 220, Step 222 forms a Cu seed layer on the Cu-receiving surface. Step 222 includes depositing the Cu seed layer at a deposition rate of approximately 260 Å per minute. Step 222 also includes the deposited Cu seed layer having a resistivity of approximately 2.0 micro-ohms centimeters ($\mu\Omega\cdot cm$). Step 224 deposits a second layer of Cu film overlying the Cu seed layer. Step 224 includes depositing the second Cu layer with deposition methods selected from the group consisting of CVD, physical vapor deposition (PVD), and electroplating. Step 226 is a product where a thick Cu film with good adhesive qualities is formed.

Figure 6:
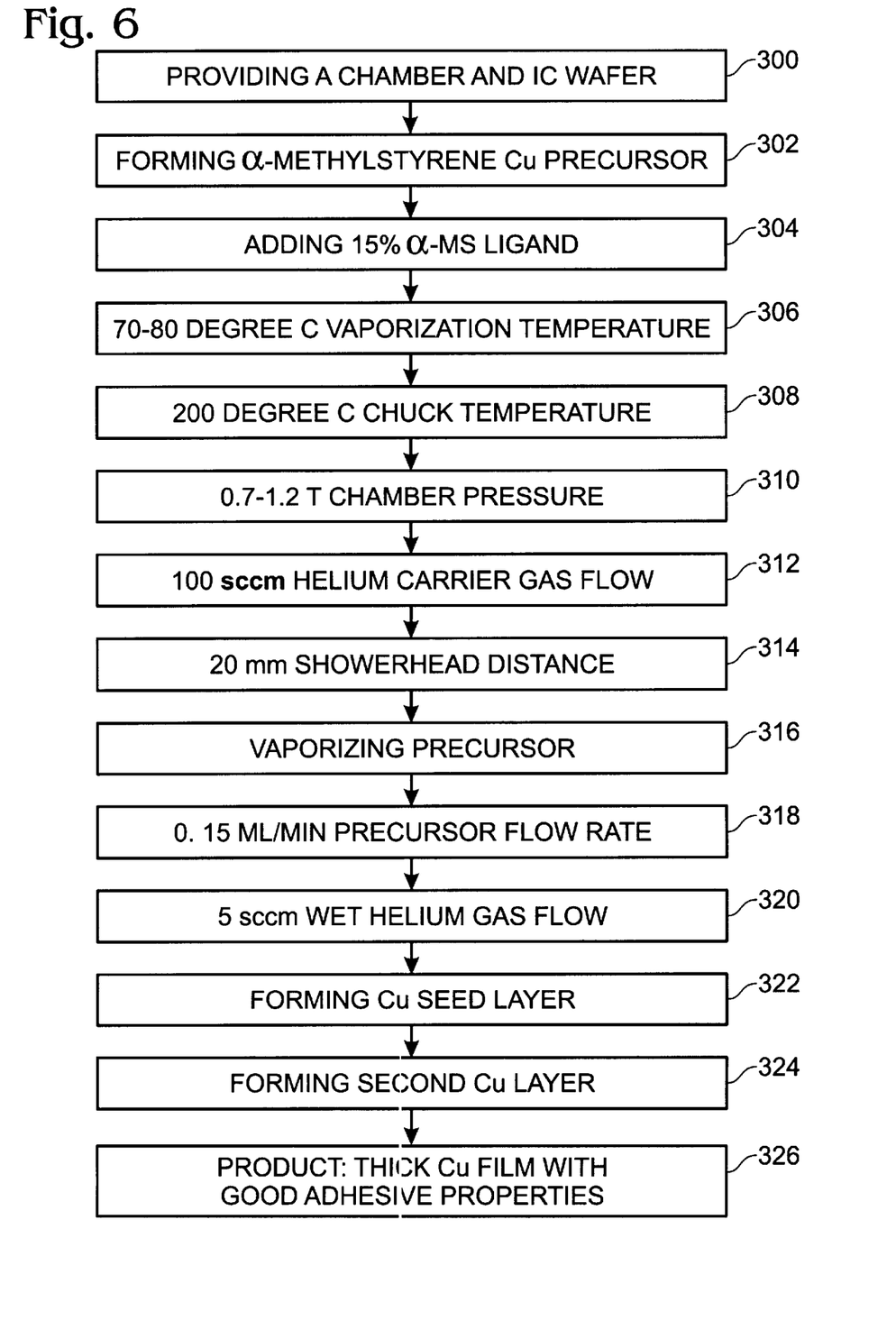
FIG. 6 is a flowchart illustrating another preferred embodiment of the deposition technique of FIG. 4 to form a Cu seed layer on a Cu-receiving surface.

FIG. 6 is a flowchart illustrating another preferred embodiment of the deposition technique of FIG. 4 to form a Cu seed layer on a Cu-receiving surface. Step 300 provides a chamber having a wafer chuck to receive an integrated circuit (IC) wafer and a showerhead to distribute materials on a Cu-receiving surface of the IC wafer. Step 302 forms a liquid Cu precursor compound including $Cu^{+1}$ (hexafluoroacetylacetonate) and an α-methylstyrene ligand. Step 304 adds approximately 15% α-methylstyrene ligand, as measured by weight ratio of the Cu precursor compound, to create a Cu precursor compound blend. Step 306 vaporizes the Cu precursor compound blend at a temperature in the range of approximately 65 degrees C. Step 308 heats the wafer chuck to a temperature of approximately 190 degrees C. Step 310 creates a chamber pressure of approximately 0.7 to 1.2 T. Step 312 carries the vaporized Cu precursor compound blend with a helium carrier gas flow of approximately 100 sccm.

Step 314 establishes a distance between the showerhead and the Cu-receiving surface of approximately 20 mm. Step 316 volatilizes the Cu precursor compound blend, including the 15% additive. Step 318 flows the Cu precursor compound blend at a liquid precursor flow rate in the range of approximately 0.15 mL/min. Step 320 carries water vapor with a helium gas flow rate of approximately of 5 sccm.

In response to steps 300 through 320, Step 322 forms a Cu seed layer on the Cu-receiving surface. Step 322 includes depositing the Cu seed layer at a deposition rate of approximately 150 Å per minute. Step 322 includes the deposited Cu seed layer having a resistivity of approximately 2.2 micro-ohms centimeters ($\mu\Omega\cdot cm$). Step 324 deposits a second layer of Cu film overlying the Cu seed layer. Step 324 includes depositing the second Cu layer with deposition methods selected from the group consisting of CVD, physical vapor deposition (PVD), and electroplating. Step 326 is a product where a thick Cu film with good adhesive qualities is formed.

Figure 7:
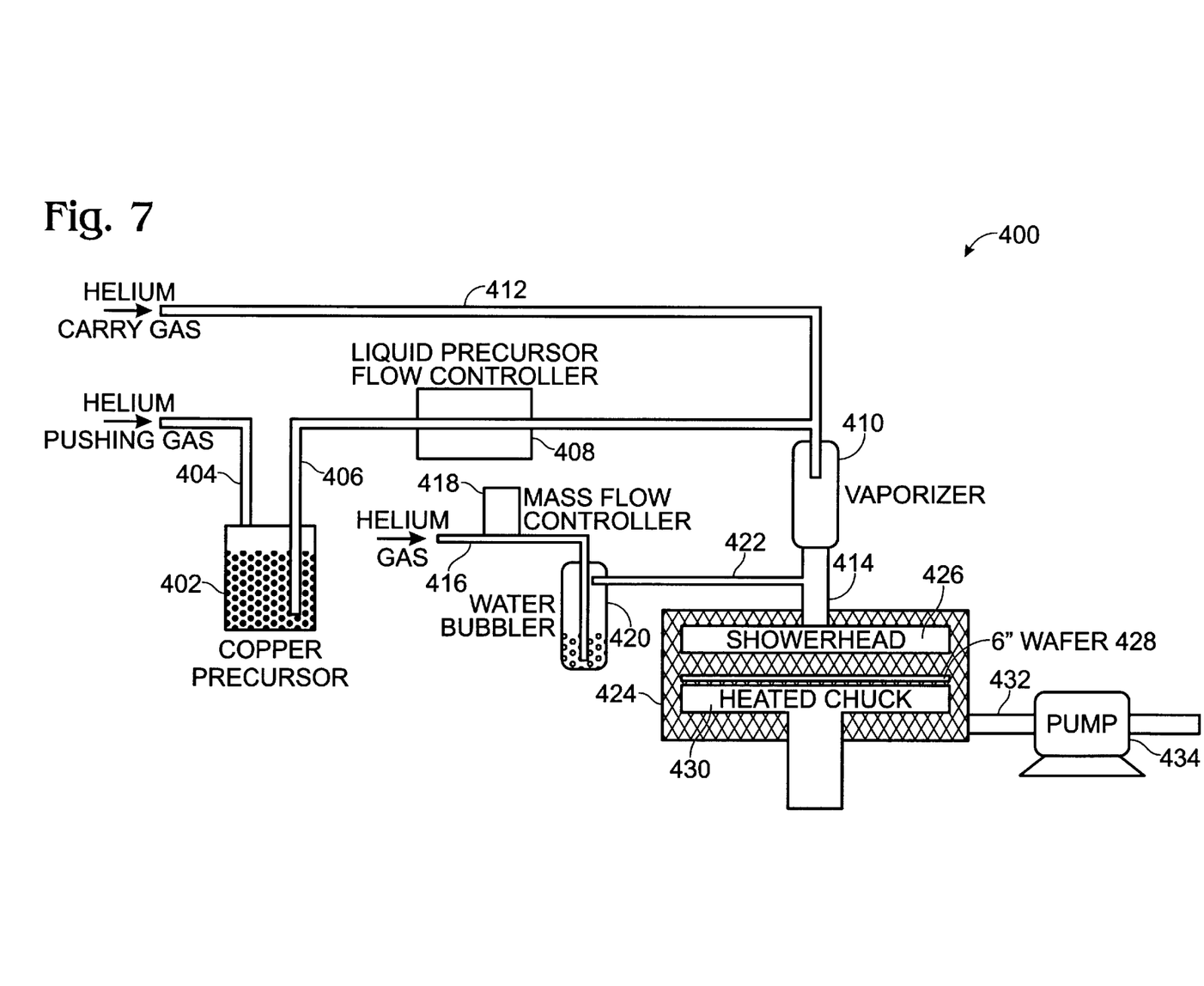
FIG. 7 is a schematic block diagram a CVD Cu deposition system sufficient to form Cu films through the methods described in FIGS. 4–6.

FIG. 7 is a schematic block diagram a CVD Cu deposition system 400 sufficient to form Cu films through the methods described in FIGS. 4–6. Liquid precursor compound fills ampoule 402. When a Cu precursor compound blend is used, additive is mixed into the precursor compound. A carrier gas, typically helium enters ampoule 402 through line 404 and liquid precursor is pushed into line 406. Flow controller 408 regulates the rate of liquid precursor flow. Liquid precursor is vaporized in vaporizer 410, which is heated. Carrier gas, typically helium, enters the system through line 412 into vaporizer 410. Vaporized precursor, with the carrier gas, leaves vaporizer 410 through line 414.

Carrier gas, typically helium, also enters line 416, with the gas flow rate being regulated by mass flow controller 418. Carrier gas enters bubbler 420, where the gas is percolated through liquid water. The "wet" helium gas carries water vapor through line 422. The wet helium gas is mixed with vaporized precursor in line 414. The gas mixture in line 414 enters chamber 424 and is distributed through showerhead 426. A wafer 428, mounted on heated chuck 430, receives the precursor, where it is decomposed to form a Cu film on wafer 428. Precursor that is not decomposed, along with waste products, exit the system through line 432. A pump 434 is used to establish a system vacuum.

A Cu seed layer deposition method has been disclosed above. The S-100™, α-methylstyrene ligand, precursor is especially adhesive to typical IC wafer surfaces. Forming an adhesive seed layer on the wafer permits the formation of a thicker overlying Cu layer through techniques that are economical or have high deposition rates. Other variations and embodiments will occur to those skilled in the art.

What is claimed is:

1. A method for depositing a copper (Cu) seed layer on a Cu-receiving surface of an integrated circuit (IC) wafer in a chamber having a chuck, on which the IC is mounted, and having a showerhead vapor distribution system, comprising the steps of:

a) in said chamber, establishing a vaporizing temperature in the range of 60 to 80 degrees C.;

establishing a chuck temperature in the range of approximately 140 to 230 degrees C.;

establishing a chamber pressure in the range of approximately 0.1 to 2 torr (T);

establishing a distance between the showerhead and the Cu-receiving surface in the range of 15 to 60 millimeters (mm); and establishing a helium carrier gas flow rate, to carry the Cu precursor compound vapor, in the range of 10 to 400 standard cubic centimeters (sccm);

establishing a liquid precursor flow rate in the range of 0.05 to 0.7 milliliters pre minute (mL/min); and volatizing a Cu precursor compound including Cu$^{+1}$ (hexafluoroacetylacetonate), and a substituted phenylethylene ligand having the following structural formula:

$(C_6H_5)(R^1)C=C(R^2)(R^3)$ in which $R^1$ is selected from the group consisting of $C_1$ to $C_6$ alkyl, $C_1$ to $C_6$ haloalkyl, phenyl, and $C_1$ to $C_6$ alkoxyl;

in which $R^2$ is selected from the group consisting of H, $C_1$ to $C_6$ alkyl, phenyl, and $C_1$ to $C_6$ alkoxyl; and in which $R^3$ is selected from the group consisting of H, $C_1$ to $C_6$ alkyl, phenyl, and $C_1$ to $C_6$ alkoxyl;

b) decomposing the Cu precursor compound on the Cu-receiving surface of the IC wafer to form a Cu seed-layer, whereby the seed layer is formed through chemical vapor deposition (CVD); and c) forming a second layer of Cu overlying the Cu seed layer, whereby the Cu seed layer enhances adhesion between the Cu films and Cu-receiving surface.

2. A method as in claim 1 further comprising a step, following Step a), of:

a8) establishing a wet helium gas flow rate, to carry water vapor, in the range of approximately 0.1 to 50 sccm.

3. A method as in claim 2 in which Step a2) includes a vaporization temperature of approximately 65 degrees C., in which Step a3) includes a chuck temperature of approximately 200 degrees C., in which Step a4) includes a chamber pressure of approximately 0.5 T, in which Step a5) includes the showerhead distance being approximately 30 mm, in which Step a6) includes a helium carrier gas flow of 100 sccm, in which Step a7) includes a liquid Cu precursor compound flow rate of approximately 0.15 mL/min, in which Step a8) includes a wet helium gas flow rate of approximately of 5 sccm, and in which Step a) includes volatilizing an α-methylstyrene Cu precursor compound.

4. A method as in claim 3 in which Step b) includes depositing the Cu seed layer at a deposition rate of approximately 260 Å per minute, and in which Step b) includes the deposited Cu seed layer having a resistivity of approximately 2.0 micro-ohms centimeters ($\mu\Omega$·cm).

5. A method as in claim 4 including a further step, preceding Step a), of:

a1) forming a liquid Cu precursor compound comprising an additive to create a Cu precursor blend, in which the Cu precursor blend further comprises approximately 5% α-methylstyrene, as measured by weight ratio of the Cu precursor compound, to facilitate a stable liquid phase precursor.

6. A method as in claim 2 in which Step a2) includes a vaporization temperature of approximately 65 degrees C., in which Step a3) includes a chuck temperature of approximately 190 degrees C., in which Step a4) includes a chamber pressure of approximately 0.7 to 1.2 T, in which Step a5) includes the showerhead distance being approximately 20 mm, in which Step a6) includes a helium carrier gas flow of 100 sccm, in which Step a7) includes a liquid Cu precursor compound flow rate of approximately 0.15 mL/min, in which Step a8) includes a wet helium gas flow rate of approximately of 5 sccm, and in which Step a) includes volatilizing an α-methylstyrene Cu precursor compound.

7. A method as in claim 6 in which Step b) includes depositing the Cu seed layer at a deposition rate of approximately 150 Å per minute, and in which Step b) includes the deposited Cu seed layer having a resistivity of approximately 2.2 micro-ohms centimeters ($\mu\Omega$·cm).

8. A method as in claim 6 including a further step, preceding Step a), of:

a1) forming a liquid Cu precursor compound comprising an additive to create a Cu precursor blend, in which the Cu precursor blend further comprises approximately 15% α-methylstyrene, as measured by weight ratio of the Cu precursor compound, to facilitate a stable liquid phase precursor.

9. In a chamber having a wafer chuck to receive an integrated circuit (IC) wafer and a showerhead to distribute materials on a Cu-receiving surface of the IC wafer, a method for forming a copper (Cu) seed layer on the Cu-receiving surface comprising steps of:

a) forming a liquid Cu precursor compound including Cu$^{+1}$(hexafluoroacetylacetonate) and an α-methylstyrene ligand;

b) adding approximately 5% α-methylstyrene ligand, as measured by weight ratio of the Cu precursor compound, to create a Cu precursor compound blend;

c) establishing a Cu precursor vaporization temperature in the range of approximately 65 degrees C.;

d) heating the wafer chuck to a temperature of approximately 200 degrees C.;

e) creating a chamber pressure of approximately 0.5 T;

f) carrying the vaporized Cu precursor compound blend with a helium carrier gas flow of approximately 100 sccm;

g) establishing a distance between the showerhead and the Cu-receiving surface of approximately 30 mm;

h) volatilizing the Cu precursor compound blend;

i) flowing the Cu precursor compound blend at a liquid precursor flow rate in the range of approximately 0.15 mL/min;

j) carrying water vapor with a helium gas flow rate of approximately of 5 sccm;

k) in response to Steps a) through j), forming a Cu seed layer on the Cu-receiving surface; and l) depositing a second layer of Cu film overlying the Cu seed layer, whereby a thick Cu film with good adhesive qualities is formed.

10. A method as in claim 9 in which Step l) includes depositing the second Cu layer with deposition methods selected from the group consisting of CVD, physical vapor deposition (PVD), and electroplating.

11. In a chamber having a wafer chuck to receive an integrated circuit (IC) wafer and a showerhead to distribute materials on a Cu-receiving surface of the IC wafer, a method for forming a copper (Cu) seed layer on the Cu-receiving surface comprising steps of:

a) forming a liquid Cu precursor compound including Cu$^{+1}$(hexafluoroacetylacetonate) and an α-methylstyrene ligand;

b) adding approximately 15% α-methylstyrene ligand, as measured by weight ratio of the Cu precursor compound, to create a Cu precursor compound blend;

c) establishing a Cu precursor vaporization temperature in the range of approximately 65 degrees C.;

d) heating the wafer chuck to a temperature of approximately 190 degrees C.;

e) creating a chamber pressure of approximately 0.5 T;

f) carrying the vaporized Cu precursor compound blend with a helium carrier gas flow of approximately 100 sccm;

g) establishing a distance between the showerhead and the Cu-receiving surface of approximately 20 mm;

h) volatilizing the Cu precursor compound blend;

i) flowing the Cu precursor compound blend at a liquid precursor flow rate in the range of approximately 0.15 mL/min;

j) carrying water vapor with a helium gas flow rate of approximately of 5 sccm;

k) in response to Steps a) through j), forming a Cu seed layer on the Cu-receiving surface; and l) depositing a second layer of Cu film overlying the Cu seed layer, whereby a thick Cu film with good adhesive qualities is formed.

12. A method as in claim 11 in which Step l) includes depositing the second Cu layer with deposition methods selected from the group consisting of CVD, physical vapor deposition (PVD), and electroplating.

* * * * *